(12) United States Patent
Choi

(10) Patent No.: US 6,295,240 B1
(45) Date of Patent: Sep. 25, 2001

(54) CONTROLLING A SENSE AMPLIFIER

(75) Inventor: Jin-Hyeok Choi, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/749,599

(22) Filed: Dec. 28, 2000

(30) Foreign Application Priority Data

Dec. 28, 1999 (KR) .................................................. 99-63873

(51) Int. Cl.⁷ ...................................................... G11C 7/02
(52) U.S. Cl. ............................................. 365/207; 365/149
(58) Field of Search ..................................... 365/207, 206, 365/193, 194, 208, 149

(56) References Cited

U.S. PATENT DOCUMENTS 5,978,255 * 11/1999 Naritake ................................. 365/149
6,034,885 * 3/2000 Chan ..................................... 365/149

* cited by examiner

Primary Examiner—A. Zarabian
(74) Attorney, Agent, or Firm—Pillsbury Winthrop LLP

(57) ABSTRACT

A semiconductor memory device arrangement that provides improved sensitivity of a sense amplifier that reads data from a memory cell. This sensitivity increase is accomplished by increasing a voltage difference between a data I/O line an a complementary data I/O line. A plurality of memory cells stor data. A data input/output (I/O) line pair (including a data I/O line and a complementary data I/O line), coupled to the memory cells, transfers the data. A sense amplifier senses and amplifies a voltage difference between the data I/O line and the complementary data I/O line. A capacitor has a first of its terminals coupled to the data I/O line. A first switching unit transfers the data applied to the data I/O line pair to two terminals of the capacitor in response to a first control signal. A second switching unit couples the second terminal of the capacitor to the data I/O line in response to a second control signal.

14 Claims, 3 Drawing Sheets

CONTROLLING A SENSE AMPLIFIER

BACKGROUND

1. Field of the Invention

The inventions claimed herein relate in general to semiconductor memory devices. More specifically, the claimed inventions relate to circuit arrangements for driving a sense amplifier for use with semiconductor memory devices. A sense amplifier is caused to achieve a high sensitivity by increasing a voltage difference between a data I/O line and a complementary data I/O line.

2. General Background and Related Art

In a semiconductor memory device, data read out from a specific memory cell is transferred via a data input/output (I/O) line pair to a sense amplifier. The sense amplifier senses and amplifies a small voltage difference between the to lines of the data I/O line pair and outputs an amplified signal that has a predetermined logic level.

FIG. 1 (Prior Art) is a block diagram showing a conventional semiconductor memory device arrangement 10 containing a two-stage sense amplifier structure. The conventional arrangement of a semiconductor memory device includes a memory cell 11, a first sense amplifier 12, a second sense amplifier 13 and a delay unit 14.

In a read operation, a data stored in the memory cell 11 is read out in response to a column select signal COLUMN_SELECT applied to the memory cell. The read data is applied to a data I/O line DB and a complementary data I/O line /DB. Then, the first sense amplifier 12, which is enabled in response to a sense amplifier strobe signal SA_STROBE, senses and amplifies a voltage difference between the data I/O line DB and the complementary data I/O line /DB to thereby generate an amplified signal.

The delay unit 14 delays the sense amplifier strobe signal SA_STROBE for a predetermined time to generate a delayed sense amplifier strobe signal. Then, the second sense amplifier 13 senses and amplifies the amplified signal in response to the delayed sense amplified strobe signal.

In the conventional semiconductor memory device 10 having the two-stage sense amplifier structure, the voltage difference between the data I/O line DB and the complementary data I/O line /DB are greatly increased through two sense amplifiers 12 and 13, si that an erroneous operation due to various noise factors can be effectively prevented.

However, since the second sense amplifier 13 is operated a predetermined time after the operation of the first sense amplifier 12, the operation speed of the semiconductor memory device is limited.

SUMMARY

The inventions claimed herein feature, at least in part, an arrangement for improving the sensitivity of a sense amplifier. This sensitivity increase is accomplished by increasing a voltage difference between a data I/O line an a complementary data I/O line.

In accordance with an aspect of the present invention, there is provided a semiconductor memory device comprising a plurality of memory cells for storing data. A data input/output (I/O) line pair (including a data I/O line and a complementary data I/O line), coupled to the memory cells, transfers the data. A sense amplifier senses and amplifies a voltage difference between the data I/O line and the complementary data I/O line. A capacitor is arranged so as to have a first of its terminals coupled to the data I/O line. A first switch transfers the data applied to the data I/O line pair to two terminals of the capacitor in response to a first control signal. A second switch means couples the second terminal of the capacitor to the data I/O line in response to a second control signal.

BRIEF DESCRIPTION OF THE DRAWINGS

The claimed inventions will be further explained by describing in detail exemplary embodiments illustrating the principles of the inventions. These exemplary embodiments are described with reference to the drawings, in which:

DETAILED DESCRIPTION

Figure 1:
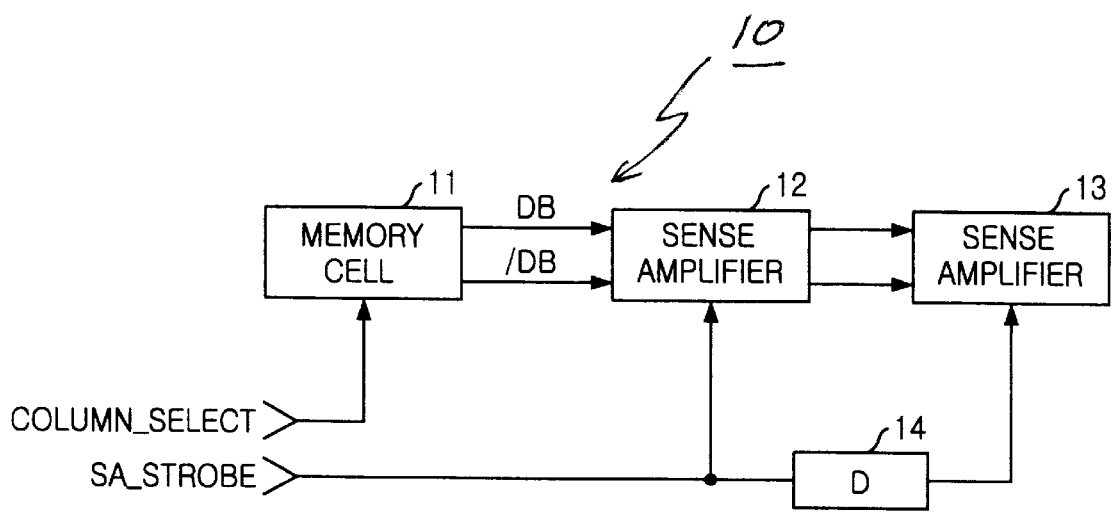
FIG. 1 (Prior Art) is a block diagram showing a conventional semiconductor memory device arrangement.
Figure 2:
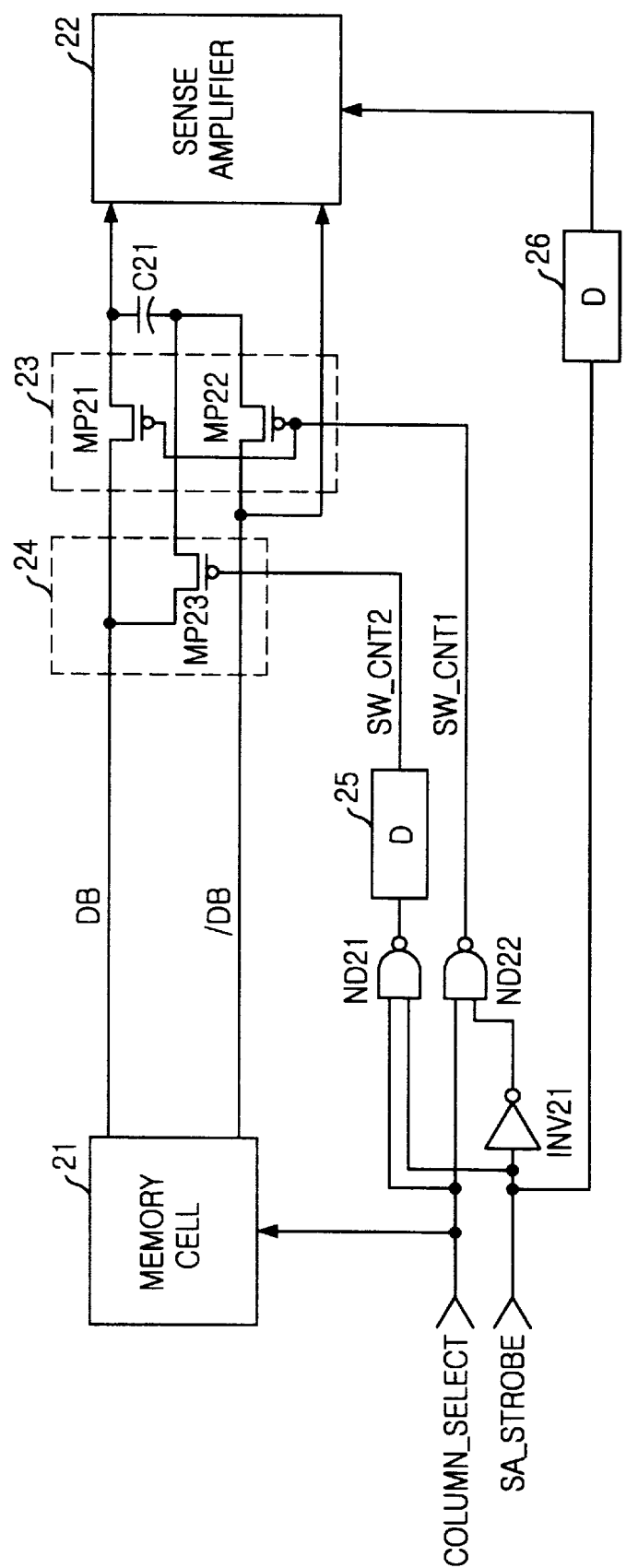
FIG. 2 is a schematic diagram illustrating a semiconductor memory device arrangement in accordance with the present invention.

FIG. 2 is a schematic diagram of a semiconductor memory device arrangement in accordance with the present invention. The semiconductor memory device 20 in accordance with the present invention includes a memory cell 21, a sense amplifier 22, a capacitor C21 coupled between a data I/O line DB and a complementary data I/O line /DB, a first switching unit 23 for transferring a data applied to the data I/O line pair DB and /DB to two terminals of the capacitor C21 in response to a first control signal SW_CNT1, a second switching unit 24 which is responsive to a second control signal SW_CNT2 and is coupled between one, e.g., DB, of the data I/O line pair and one terminal of the capacitor C21.

First control signal SW_CNT1 is provided by NANDing (using gate ND22) a column select signal COLUMN_SELECT and an inverted (inverted by INV21) sense amplifier strobe signal. The second control signal SW_CNT2 is provided by NANDing (using gate ND21) the column select signal COLUMN_SELECT and a sense amplifier strobe signal SA_STROBE and delaying the output of gate ND21 for a predetermined time using a delay unit 25. Sense Amplifier 22 is strobed by SA_STROBE delayed by a delay unit 26.

Capacitor C21 is constructed and arranged so that its capacitance is larger than a static capacitance of an input terminal of the sense amplifier and smaller than a parasitic capacitance of the data I/O line pair The first switching unit 23 includes a PMOS transistor MP21 for coupling the data I/O line DB to one input terminal of the sense amplifier 22 in response to the first control signal SW_CNT1, and a PMOS transistor MP22, coupled between the capacitor C21 and the complementary data I/O line /DB, whose gate receives the first control signal SW_CNT1.

The second switching unit 24 is implemented with a PMOS transistor MP23, coupled between one terminal of the capacitor C21 and the data I/O line DB, whose gate receives the second control signal SW_CNT2.

Operation of the semiconductor memory device arrangement 20 in accordance with the present invention will be described with reference to Fig. 2. When the column select signal COLUMN_SELECT is activated, the PMOS transistors MP21 and MP22 contained in the first switching unit 23 are turned on so that a potential corresponding to the data read out from the memory cell 21 is applied to two terminals of the capacitor C21. Then, when the sense amplifier strobe signal SA_STROBE is activated to a low level, the PMOS transistors MP1 and MP2 are turned off in response to the second control signal SW_CNT2 of a high level.

The other terminal of capacitor C21 (the one that is not coupled to one input terminal of the sense amplifier 22) is electrically coupled to the second switching unit 24. As a result, the PMOS transistor MP3 contained in the second switching unit 24 is turned on in response to an activated sense amplifier strobe signal SA_STROBE.

Delay unit 25 has a minimum delay time required to prevent the second switching unit 24 from being turned on before the first switching unit 23 is turned off. That is, data damage, which is caused by a potential applied to two terminals of the capacitor C21 when the PMOS transistor MP3 is turned on, can be effectively prevented due the delay unit 25.

When the PMOS transistor MP3 is turned on, one terminal of the capacitor C21 is electrically coupled to the data I/O line DB. Therefore, a potential on the data I/O line DB is increased by a voltage difference induced to the capacitor C21. Accordingly, a voltage difference inputted to the sense amplifier 22 becomes about twice the voltage difference between the data I/O line DB and the complementary data I/O line /DB.

Figure 3:
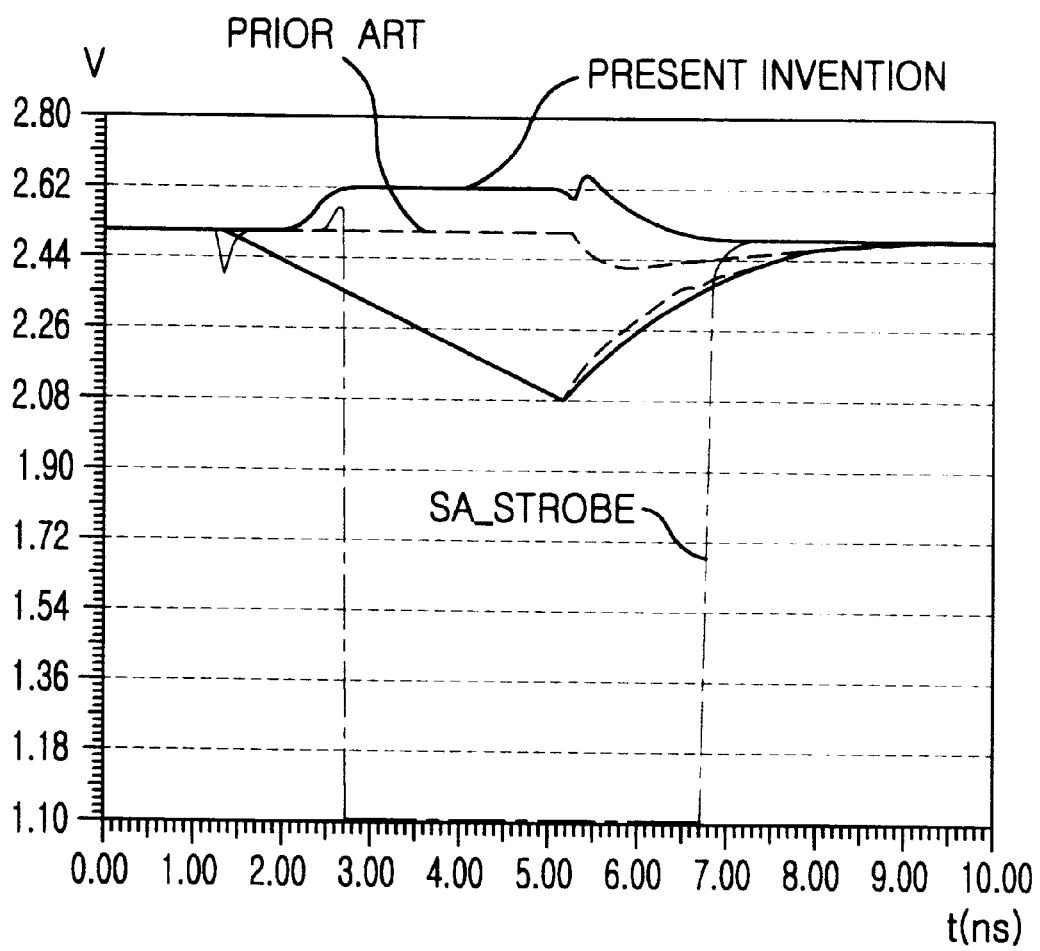
FIG. 3 is a graphical representation of a simulation comparing results of sensing operations of the prior art arrangement and the arrangement according to the inventions described herein.

FIG. 3 is a graphical representation of a simulated comparison of the resulting operation of the prior art arrangement with that of the claimed inventions. Compared with the prior art, a voltage difference according to the present invention becomes larger, thereby obtaining an improved sensitivity of the sense amplifier.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising;
   a plurality of memory cells for storing data;
   a data input/output (I/O) line pair, coupled to the memory cells, for transferring the data, the data I/O line pair including a data I/O line and a complementary data I/O line;
   a sense amplifying means for sensing and amplifying a voltage difference between the data I/O line and the complementary data I/O line;
   a capacitor having a first terminal coupled to the data I/O line;
   a first switching means for transferring the data applied to the data I/O line pair to two terminals of the capacitor in response to a first control signal; and
   a second switching means for coupling the second terminal of the capacitor to the data I/O line in response to a second control signal.

2. The semiconductor memory device as recited in claim 1, wherein the first control signal is provided by NANDing a column select signal and an inverted signal of a sense amplifier strobe signal for enabling the sense amplifying means.

3. The semiconductor memory device as recited in claim 2, wherein the second control signal is provided by NANDing the column select signal and the sense amplifier strobe signal.

4. The semiconductor memory device as recited in claim 3, wherein the first switching means includes:
   a first PMOS transistor for coupling the data I/O line to one input terminal of the sense amplifying means in response to the first control signal; and
   a second PMOS transistor, coupled between the other terminal of the capacitor and the complementary data I/O line, whose gate receives the first control signal.

5. The semiconductor memory device as recited in claim 4, wherein the second switching means is a PMOS transistor, coupled between the other terminal of the capacitor and the data I/O line, whose gate receives the second control signal.

6. The semiconductor memory device as recited in claim 5, further comprising a delay means for delaying a NANDed signal of the column select signal and the sense amplifier strobe signal for a predetermined time to output a delayed and NANDed signal as the second control signal to the second switching means.

7. The semiconductor memory device as recited in claim 1, wherein a capacitance of the capacitor is larger than a static capacitance of an input terminal of the sense amplifying means and smaller than a parasitic capacitance of the data I/O line pair.

8. A semiconductor memory device comprising;
   a plurality of memory cells for storing data;
   a data input/output (I/O) line pair, coupled to the memory cells, for transferring the data, the data I/O line pair including a data I/O line and a complementary data I/O line;
   a sense amplifier constructed and arranged to sense and amplify a voltage difference between the data I/O line and the complementary data I/O line;
   a capacitor having a first terminal coupled to the data I/O line;
   a first switch constructed and arranged to transfer the data applied to the data I/O line pair to two terminals of the capacitor in response to a first control signal; and
   a second switch constructed and arranged to couple the second terminal of the capacitor to the data I/O line in response to a second control signal.

9. The semiconductor memory device as recited in claim 8, wherein the first control signal is provided by NANDing a column select signal and an inverted signal of a sense amplifier strobe signal for enabling the sense amplifier.

10. The semiconductor memory device as recited in claim 9, wherein the second control signal is provided by NANDing the column select signal and the sense amplifier strobe signal.

11. The semiconductor memory device as recited in claim 10, wherein the first switch:
    a first PMOS transistor for coupling the data I/O line to one input terminal of the sense amplifying means in response to the first control signal; and
    a second PMOS transistor, coupled between the other terminal of the capacitor and the complementary data I/O line, whose gate receives the first control signal.

12. The semiconductor memory device as recited in claim 11, wherein the second switch is a PMOS transistor, coupled between the other terminal of the capacitor and the data I/O line, whose gate receives the second control signal.

13. The semiconductor memory device as recited in claim 12, further comprising a delay unit constructed and arranged to delay a NANDed signal of the column select signal and the sense amplifier strobe signal for a predetermined time to output a delayed and NANDed signal as the second control signal to the second switch.

14. The semiconductor memory device as recited in claim 8, wherein the capacitor is constructed and arranged so as to have a capacitance that is larger than a static capacitance of an input terminal of the sense amplifier and smaller than a parasitic capacitance of the data I/O line pair.

* * * * *